United States Patent [19]
Kopf et al.

[11] Patent Number: 5,115,441
[45] Date of Patent: May 19, 1992

[54] VERTICAL CAVITY SURFACE EMMITTING LASERS WITH TRANSPARENT ELECTRODES

[75] Inventors: Rose F. Kopf, Bound Brook; Henry M. O'Bryan, Jr., Plainfield; Erdmann F. Schubert, New Providence; Li-Wei Tu, Westfield; Yeong-Her Wang, Scotch Plains; George J. Zydzik, Warren County, all of N.J.

[73] Assignee: AT&T Bell Laboratories, Murray Hill, N.J.

[21] Appl. No.: 637,245

[22] Filed: Jan. 3, 1991

[51] Int. Cl.$^5$ ................................. H01S 3/19
[52] U.S. Cl. ............................ 372/45; 372/92; 372/99
[58] Field of Search ............... 372/45, 46, 92, 49, 372/44, 99

[56] References Cited

U.S. PATENT DOCUMENTS

| | | | |
|---|---|---|---|
| 4,873,696 | 10/1989 | Coldren et al. | 372/96 |
| 4,949,351 | 8/1990 | Imanaka | 372/45 |
| 5,012,486 | 4/1991 | Luryi et al. | 372/45 |
| 5,018,157 | 5/1991 | Deppe et al. | 372/45 |

FOREIGN PATENT DOCUMENTS

| | | |
|---|---|---|
| 60-81888 | 5/1985 | Japan. |
| 60-97684 | 5/1985 | Japan. |
| 146996 | 2/1989 | Japan. |

OTHER PUBLICATIONS

Kenichi Iga, "Recent Advances of Surface Emitting Semiconductor Lasers," *Optoelectronics-Devices and Technologies*, vol. 3, No. 2, Dec. 1988, pp. 131-142.
L. M. Zinkiewicz et al., "High Power Vertical-Cavity Surface-Emitting AlGaAs/GaAs Diode Lasers," *Appl. Phys. Letters*, vol. 54, No. 20, May 15, 1989, pp. 1959-1961.
Deppe D. G., et al., "AlGaAs-GaAs and AlGaAs-GaAs-InGaAs vertical cavity Surface emitting lasers with Ag mirrors," *Journal of Applied Physics*, vol. 66, No. 11, Dec. 1, 1989, pp. 5629-5631.
E. F. Schubert et al., "Low-threshold vertical cavity surface-emitting lasers with metallic reflectors", *Appl. Phys. Letters*, vol. 57, No. 2, Jul. 9, 1990, pp. 117-119.
L. W. Tu et al., "Vertical-cavity surface-emitting lasers with semitransparent metallic mirrors and high quantum efficiencies", *Appl. Phys. Letters*, vol. 57, No. 20, Nov. 12, 1990, pp. 2045-2047.
Y. H. Lee et al., "Top-Surface-Emitting GaAs Four-Quantum-Well Lasers Emitting At 0.85 μm", *Electronics Letters*, vol. 26, No. 11, May 24, 1990, pp. 710-711.

*Primary Examiner*—James W. Davie
*Attorney, Agent, or Firm*—Oleg E. Alber

[57] ABSTRACT

Optically transparent and electrically conductive cadmium tin oxide or indium tin oxide is employed in vertical cavity surface emitting lasers for vertical current injection. Continuous wave lasing at room temperature is achieved in GaAs/AlGaAs quantum well lasers. Devices with a 10 μm optical window which also serves as a vertical current injection inlet give lasing threshold currents as low as 3.8 mA. The differential series resistance is (350–450) Ω with a diode voltage of (5.1–5.6) V at the lasing threshold. Far field pattern of the laser emission is Gaussian-like with a full width at half maximum of 7°.

19 Claims, 3 Drawing Sheets

VERTICAL CAVITY SURFACE EMMITTING LASERS WITH TRANSPARENT ELECTRODES

FIELD OF THE INVENTION

This invention concerns Vertical Cavity Surface Emitting lasers having optically transparent electrodes.

BACKGROUND OF THE INVENTION

The Vertical Cavity Surface Emitting Laser diode, hereinafter referred to as a VCSEL, is attractive as a device which may be produced by planar technology and as a class of devices with a wide range of potential uses including optical communications, optical discs, laser printers and light sensing systems. In the VCSEL, the lasing cavity is perpendicular to the optical surface of a laser chip. Therefore, high packing density, compared to the packing density of edge-emitting lasers with the lasing cavity parallel to the surface of the laser chip, is obtainable. This leads to a promising future in high density laser arrays, high data transmission in optical communication systems, high parallel processing in optical communication systems, as well as supplying a route for fast and high capacity data transmission between electronic chips. Furthermore, the radial symmetry of their beams makes them suited for beam-combining with cylindrical fibers.

In the VCSEL the light output is in the film growth direction which is usually parallel to the direction of the injection current. Due to this feature, the mirror through which laser emission takes place and the electrical contact physically occupy the same side of the laser structure, i.e. either on the top or on the bottom of the device. Typically, the mirror is located approximately in the center of the surface while the electrode is located peripherally of the mirror. For example, see Kenichi Iga, "Recent Advances of Surface Emitting Semiconductor Lasers," *Optoelectronics-Devices and Technologies*, Vol. 3, No. 2, December 1988, pp. 131–142, and L. M. Zinkiewicz et al., "High Power Vertical-Cavity Surface-Emitting AlGaAs/GaAs Diode Lasers," *Appl. Phys. Letters*, Vol. 54, No. 20, May 15, 1989, pp. 1959–1961.

An attempt to simplify the construction of a VCSEL by combining the mirror and the electrode into a single unit led to relatively low quantum efficiencies. See Deppe D. G. et al., "AlGaAs-GaAs and AlGaAs-GaAs-InGaAs vertical cavity surface emitting lasers with Ag mirrors," *Journal of Applied Physics*, Vol. 66, No. 11, Dec. 11, 1989, pp. 5629–5631. The mirrors comprised a 0.55 μm thick reflective Ag mirror which also acted as the electrode of the laser. The emission took place through the λ/4 reflector semiconductor stack arranged opposite to the mirror/electrode. U.S. Pat. No. 4,949,351 issued Aug. 14, 1990 to Koich Imanaka discloses a Ti, Pt and Au layered structure with a total thickness of 900 Å, which is used as an electrode-mirror. An article by E. F. Schubert et al., "Low-threshold vertical cavity surface-emitting lasers with metallic reflectors", Applied Physics Letters, 57 (2), Jul. 9, 1990, p. 117–119, L. W. Tu et al., "Vertical-Cavity Surface Emitting Lasers With Semi-Transparent Metallic Mirrors And High Quantum Efficiencies", *Applied Physics Letters*, 57(20), Nov. 12, 1990, pp. 2045–2047, and U.S. application Ser. No. 07/526,204, filed May 21, 1990 (Deppe D. G. disclose a VCSEL with a metallic mirror which simultaneously acts as an electrode of the device with a thickness sufficient to permit lasing emission through the mirror-electrode. However, while the quantum efficiency of the latter is improved over the structure of Deppe D. G. or Imanaka, there is still a substantial loss in transmission of the lasing emission through the metallic mirror-electrode.

Therefore, there is still a need for a VCSEL with an improved quantum efficiency and light transmission and which could be also produced in a simplified manner utilizing planar technology.

SUMMARY OF THE INVENTION

This invention is a semiconductor vertical cavity surface emitting laser comprising a lasing cavity with an active layer, a top and bottom multilayer DBR mirror and a top and bottom electrode for applying excitation current in the direction parallel to the direction of optical propagation. The VCSEL is a semiconductor device wherein the semiconductor material is a III–V or II–VI compound semiconductor such as GaAs, GaInAs, InP, InGaPAs, AlGaInAs, AlGaAs and other related semiconductors. In accordance with this invention, the top electrode comprises an optically transparent material selected from conductive semiconductors having conductivities within a range of from $1 \times 10^3$ to $1 \times 10^5$ $\Omega^{-1}$cm$^{-1}$, light transmissivity of at least 80 percent and absorption of less than 10 percent. Cadmium tin oxide and indium tin oxide, deposited in thicknesses ranging from 50 to 500 nm, satisfy these requirements. The electrode layer is upon a very thin metal barrier layer which forms a non-alloyed barrier between the p-type top mirror and the n-type electrode layer. For a VCSEL with a GaAs active layer, the light output from the top electrode side yields an external differential quantum efficiency as high as 54 percent. This VCSEL is suitable for fabrication utilizing planar technology.

The vertical-injection VCSEL structure using optically transparent and electrically conductive cadmium tin oxide or indium tin oxide provides a solution to the fundamental difficulty in prior art VCSELs, i.e. here the light and current occupy the same path. Room temperature continuous wave operation with low threshold current is achieved. The Gaussian-like far field pattern indicates a single fundamental transverse mode.

DETAILED DESCRIPTION

The invention is a VCSEL in which the lasing cavity comprises an active layer, a top and bottom mirror each consisting of a stack of a plurality of pairs (or periods) of semiconductor layers forming quarter-wave multilayer distributed Bragg reflector (DBR) structure, and a top and bottom electrode, respectively. The top electrode is of semiconductor material which is optically transparent to lasing emission from the active layer and permits lasing emission to take place through the top mirror. The light output from the mirror and through the optically transparent top electrode yields a high differential quantum efficiency which is as high as 54 percent. This device may be conveniently produced by planar technology.

Figure 1:
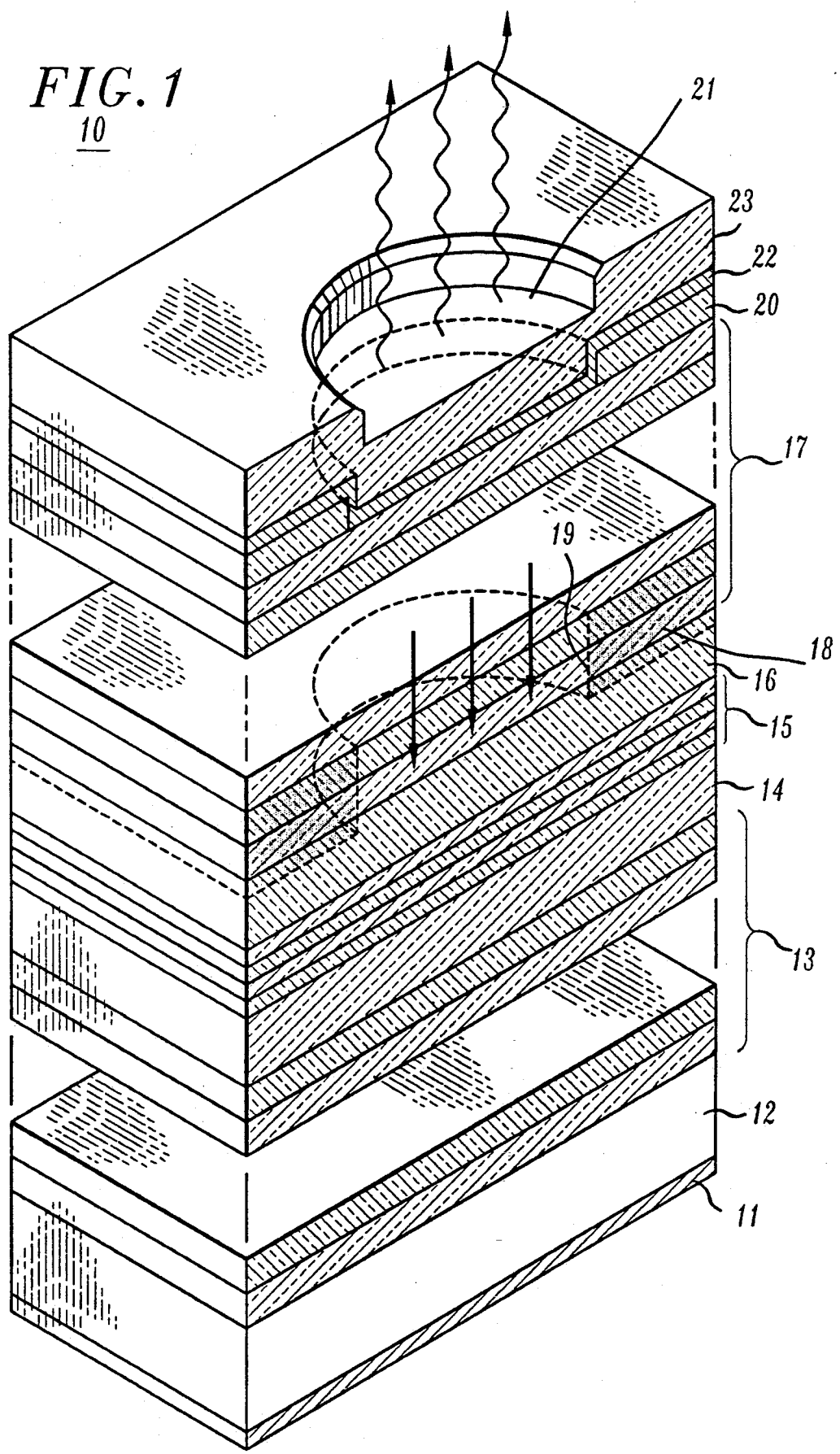
FIG. 1 is a schematic representation of a vertical-injection VCSEL with a transparent top electrode; current is vertically injected through the optical window as indicated by arrows.

FIG. 1 is a general schematic representation of a VCSEL according to this invention, denominated generally as 10. For reasons of clarity the elements of the VCSEL are not drawn to scale. VCSEL 10 comprises, in an ascending order, a bottom electrode, 11; a substrate, 12; a quarter-wave stack of a plurality of pairs (or periods) of semiconductor layers which forms a bottom mirror, 13; a first confining layer, 14; an active region, 15; a second confining layer, 16; another quarter-wave stack of a second plurality of pairs (or periods) of semiconductor layers which forms a top mirror, 17; an ionized region, 18, of ions implanted into peripheral annuler region of the top mirror defining a centrally located circular window, 19, in the top mirror; a dielectric layer, 20, upon the top mirror, said dielectric layer having a centrally located window, 21, essentially coextensive vertically with window 19; a barrier metal layer, 22, upon dielectric layer 20 and that portion of top mirror 17 which is exposed in window 21; and an optically transparent, semiconductor layer, 23, which acts as a top electrode of the device. While not shown, additional confining and buffer layers may be included into the laser structure. Optionally, if the conductivity of the uppermost layer of top mirror 17 is insufficient to form a non-alloyed ohmic contact to barrier layer 22, a thin highly doped contacting layer (not shown) may be interposed between the top mirror 17 and barrier layer 22.

A more detailed construction of VCSEL 10, in accordance with the invention, may be described as being generally as follows:

Substrate 12 is a heavily doped n+-type III-V or II-VI semiconductor, such as GaAs, AlGaAs, GaInAs, InP, InGaPAs, AlGaInAs and other related group III-V or II-VI compound semiconductors. Typically, the thickness of the substrate ranges from 100 to 650 $\mu$m and the doping concentration of the substrate ranges from $1 \times 10^{17}$ to $4 \times 10^{18}$ cm$^{-3}$. In some applications, such as opto-electronic integrated circuitry, substrate 12 may be first grown on a master substrate of silicon, which is in common to a number of devices grown on the master substrate.

An n+ doped quarterwave semiconductor stack upon substrate 12 is composed of a plurality of pairs or periods of semiconductor layers forming multilayer distributed Bragg reflector (DBR) bottom mirror 13 with a number of pairs (or periods) typically ranging from 10 to 40. One semiconductor layer in each pair or period has a higher index of refraction than the other semiconductor layer of the pair. The thickness of each semiconductor in the pair equals $\lambda/4\eta$, wherein $\lambda$ is the operational optical wavelength of the laser device and $\eta$ is the refractive index of the semiconductor material. For a device with an active region lasing at $\lambda=0.87$ $\mu$m, such as a GaAs laser, a quarterwave stack of pairs of such semiconductors as GaAs and AlAs with refractive indices of 3.64 and 2.97, respectively, will consist of 62 nm thick GaAs layer and 73 nm thick AlAs layer while a stack of Al$_{0.05}$Ga$_{0.95}$As and AlAs will consist of pairs of layers 60 nm and 73 nm thick each, respectively. To reduce series resistance, the n-type bottom mirror may be deposited as a one-step graded structure, each period of such bottom mirror being with a structure of Al$_{0.14}$Ga$_{0.86}$As(500 Å)/Al$_{0.57}$Ga$_{0.43}$As(100 Å)/AlAs(500 Å)/Al$_{0.57}$Ga$_{0.43}$As(100 Å). Alternatively, the mirror structure may be provided with linear grading or with a superlattice grading of the stack.

Confining layers 14 and 16 are provided to confine active region 15 and to adjust the length (L) of the optical cavity. This optical cavity length should be 2 L=N·$\lambda$, wherein N is an integer and $\lambda$ is an operating optical wavelength of the laser. To obtain constructive interference, the thickness of the confining layers should be a multiple of $\lambda/2$ or $\lambda/4$. Typically, the thickness of each confining layer ranges from 0 to 3 $\mu$m. The confining regions are Al$_x$Ga$_{1-x}$As, with x ranging from 0.1 to 0.4.

Active region 15 is a region in which electrons (−) and holes (+) recombine providing, under proper stimulation, a lasing emission. The active region with a thickness ranging from 0.1 to 1 $\mu$m, is a multi-quantum well (MQW) structure with very thin barriers. Each quantum well includes a narrow gap semiconductor 1 to 30 nm thick, confined by wide-gap semiconductor about 1 to 20 nm in thickness.

The second quarter-wave stack of from 2 to 20 pairs or periods of high index/low index material layers similar to the pairs or periods in bottom mirror 13, but with p+-type doping ($1 \times 10^{18}$ to $5 \times 10^{19}$ cm$^{-3}$), forms multilayer DBR top mirror 17 upon confining layer 16. The peripheral region of the top mirror includes ion-implanted region 18. The ions are implanted into the peripheral region of top mirror 17, creating window 19 so that both the current and the lasing emission are confined to a narrow centrally located region. The ions are selected from ions (protons) of elements which do not affect the conductivity type of the material in which they are implanted. Ions, such as H+ or O+, are implanted in concentrations ranging from $1 \times 10^{18}$ to $5 \times 10^{19}$ per cm$^3$.

A thin layer 20 of dielectric material, such as SiO$_2$, Si$_3$N$_4$, borosilicate glass, such as Vycor®, etc., is formed upon top mirror 17 with a thickness ranging from 0.01 to 0.1 $\mu$m. Layer 20 has a centrally located window 21 which is substantially coextensive with window 19 formed in the ion-implanted area 18. Windows 19 and 21 cooperate in restricting the laser emission to the centrally located region. Layer 20 also permits passage of operating current only through window 21, thus restricting the current flow to a narrow area of the active region. Each of the windows is from 5 to 50 $\mu$m, preferably 10 to 20 $\mu$m, in diameter.

Optically transparent top electrode 23 is deposited as a layer on top of the structure with lasing emission from active layer 15 taking place through the top mirror and through the top electrode. In accordance with this invention, the electrode material is selected from optically transmissive semiconductor materials having conductivities ranging from $1 \times 10^3$ to $1 \times 10^5$ $\Omega^{-1}$cm$^{-1}$, light transmissivity greater than 80 percent and light absorption of less than 10 percent. The optically transmissive semiconductor layer is applied in the laser structure onto the top mirror to serve as the vertical-injection contact without substantially interfering with the light output. Cadmium tin oxide (CTO) and indium tin oxide (ITO), with the respective nominal formula $Cd_{2-x}Sn_xO_4$ with x ranging from 0.01 to 0.5, preferably from 0.3 to 0.4, and $In_{2-y}Sn_yO_3$, with y ranging from 0.01 to 0.2, are especially suitable for this purpose. The cadmium tin oxide is optically transparent (greater than 80 percent) with a negligible absorption ($<1\%$) and is electrically conductive with a conductivity of $2 \times 10^3$ $\Omega^{-1}cm^{-1}$ and resistivity of $5 \times 10^{-4}$ $\Omega cm$ at room temperature. The indium tin oxide is also optically transparent (greater than 90 percent) with a very small absorption ($<5\%$) and is electrically conductive with a conductivity of $2.5 \times 10^3$ $\Omega^{-1}cm^{-1}$ and resistivity of $4 \times 10^{-4}$ $\Omega cm$ at room temperature. These materials, when deposited in thickness ranging from 50 nm to 500 nm, preferably from 200 to 300 nm, provide electrical conductivity sufficient for use as an electrode of the laser and yet exhibit transparent properties with transmissivity (T) greater than 80 percent and absorption $<10$ percent.

Prior to the deposition of top electrode 23, a thin metal barrier layer 22 is deposited on top of the dielectric layer 20 and on that portion of top mirror 17 which is exposed in window 21. This barrier layer is deposited in a thickness of up to 300 Å, preferably from 10 to 50 Å. The barrier layer is used to avoid formation of another p-n junction between the p-type conductivity top mirror 17 and n-type conductivity semiconductor top electrode 23, which could interfere with the lasing emission. The barrier layer is selected from metals or alloys which do not cause contamination of the materials of the device, are capable of forming a non-alloyed ohmic contact with the surface of top mirror 17 and when deposited within the above thickness range do not substantially interfere with the transmission of the lasing emission.

Optionally, if the conductivity of an uppermost layer of top mirror 17 is insufficient to form a non-alloyed ohmic contact to barrier layer 22, a thin highly doped contacting layer (not shown) may be provided intermediate top mirror 17 and barrier layer 22 with a thickness ranging from 0.01 to 0.1 $\mu m$, preferably about 0.0625 $\mu m$, to facilitate establishment of the non-alloyed ohmic contact between the top mirror and the barrier metal layer. Typically, the doping concentration in the optional contacting layer would range from $1 \times 10^{19}$ to $1 \times 10^{20}$ $cm^{-3}$, preferably about $5 \times 10^{19}$ $cm^{-3}$.

Metal electrode 11 ranging from 1 to 10 $\mu m$ in thickness is formed on the bottom surface of substrate 12 to provide for current flow perpendicularly through the active region to cause lasing emission. Indium is a metal which may be deposited as a thin layer without causing undue heating of the structure. The laser may be mounted with electrode 11 in contact with a heat-sink plate, e.g. of copper or some other heat-conductive material which does not contaminate the laser materials.

Semiconductor layers 13 through 17 can be grown upon substrate 12 by such known methods as metal organic vapor phase epitaxy (MOVPE) or by molecular beam epitaxy (MBE) or by hydride vapor phase epitaxy (VPE). In the preferred embodiment, the VCSEL structures are grown by Molecular Beam Epitaxy (MBE) technology in a Varian Gen II or Riber MBE system on heavily doped ($1 \times 10^{17} - 4 \times 10^{18}$ $cm^{-3}$) substrates 12. After layers 13 through 17 are grown, windows 19 and 21 are defined by photolithographic technique by depositing a suitable resist on the centrally located upper surface of top mirror 17. The partially formed structure with resist thereon is transferred to a separate high vacuum chamber where the structure is subjected to ion implantation, e.g. $H^+$ or $O^+$, to form ion-implanted region 18. After dielectric layer 20 is formed on the upper surface of top mirror 17 and the resist is removed, thin metal barrier layer 22 is deposited on top of the dielectric layer and on the upper surface of top mirror 17 exposed in window 21. Such a metal layer is conveniently deposited by evaporation at temperatures ranging from 100° to 500° C., preferably from 100° to 250° C., by sputtering or by electron-beam deposition. The latter process is preferable since the higher temperatures needed for evaporation could result in undesirable alloying of the metal into the semiconductor leading to a rough interface morphology which degrades the reflection properties of the mirror. After the deposition of the barrier layer, optically transparent semiconductor top electrode 23 is deposited on top of the structure. The top electrode is deposited with a thickness sufficient to enable the semiconductor material of the electrode to act as a terminal conductor for the device and yet insufficient to effectively reduce lasing emission from the top mirror. For such semiconductor materials as cadmium tin oxide and indium tin oxide, an effective thickness falls within a range of from 50 nm to 500 nm. Thin bottom electrode layer 11, e.g., of In, may then be formed on the bottom surface of substrate 12. Finally, the bottom or substrate side of the laser may be mounted via the In electrode or by means of a conductive adhesive, such as epoxy, on a copper slab which serves as a heat sink in common to other devices.

In the preferred embodiment, the VCSEL is an $Al_xGa_{1-x}As/GaAs$ with x being defined appropriately hereinbelow for each semiconductor layer of the structure. The laser structure comprises in an ascending sequence a 1 to 2 $\mu m$ thick In electrode 11, a 500 $\mu m$ thick (001)-oriented heavily doped ($2 \times 10^{18}$ $cm^{-3}$) $n^+$-GaAs substrate 12, bottom mirror 13 consisting of a quarter-wave stack of 30 periods of $n+$-type semiconductor layers forming the multilayer distributed Bragg reflector (DBR) bottom mirror. Each period of the bottom mirror is of an one-step graded structure of $Al_{0.14}Ga_{0.86}As(500$ Å$)/Al_{0.57}Ga_{0.43}As(100$ Å$)/AlAs(580$ Å$)/Al_{0.57}Ga_{0.43}As(100$ Å$)$. It is Si-doped with a doping concentration of $3 \times 10^{18}$ $cm^{-3}$ near the substrate, which is then reduced to $1 \times 10^{18}$ $cm^{-3}$ in the last 6–10 periods near the active layer. The reflectivity spectrum of the DBR structure (bottom mirror 13) with the one-step graded structure, as measured with a Perkin-Elmer Lambda 9 UV/VIS/NIR Spectrophotometer, showed a broad high reflectivity band centered at $\sim 0.87$ $\mu m$ with a reflectivity $>99$ percent, which matches a calculated reflectivity curve very well.

The bottom mirror is followed by $n^+$−confinement layer 14, a $p^-$-active region layer 15 of four GaAs/AlGaAs quantum well structures about 0.1 $\mu m$ total thickness and $n^+$—confinement layer 16. Each of the confinement layers is about 820 Å thick. The GaAs/AlGaAs four quantum well structures of the active region are grown in a Riber MBE system. The active region is undoped, and consists of four 100 Å GaAs quantum wells with 70 Å $Al_{0.3}Ga_{0.7}As$ barriers. The active region is clad on the top and bottom by respective confinement layers 14 and 16. One-third of each confinement layer near the active region is undoped, and the rest is lightly doped ($1 \times 10^{16} - 1 \times 10^{17}$). Each confinement layer is linearly graded $Al_xGa_{1-x}As$ with x graded from 0.3 to 0.57 near the mirrors. This graded-index, separate-confinement heterostructure helps the carrier confinement and reduces the lasing threshold current.

P-type top mirror 17 is a 20-period semiconductor mirror, which is also one-step graded to reduce the series resistance. Each period of the top mirror has a structure of $Al_{0.14}Ga_{0.86}As$ (500 Å)/$Al_{0.57}Ga_{0.43}As$ (100 Å)/AlAs (580 Å)/$Al_{0.57}Ga_{0.43}As$ (100 Å). It is Be-doped with a doping concentration of $5 \times 10^{18}$ cm$^{-3}$ in the first 16 periods. Then, the dopant concentration is increased to $2 \times 10^{19}$ cm$^{-3}$ near its upper surface to facilitate contacting.

At this fabrication stage the incomplete laser structure may be examined with the reflectivity measurement using an Anritsu MS9001B optical spectrum analyzer. The reflectivity measurements show Fabry-Perot resonance as a clear dip in the stop band. Then, ion-implanted region 18 is formed by implanting 300 ke V H$^+$ ions (or 2000 ke V O$^+$ ions) with a dose of $1 \times 10^{15}$ cm$^{-2}$ into top mirror 17 with a 10-20 $\mu$m diameter window protected by 6.2 $\mu$m thick photoresist (e.g. Shipley AZ Photoresist 4200). Upon formation of the ion-implanted region 18, and with the photoresist still in place, a 500 to 5000 Å, preferably 1000 to 2000 Å, thick SiO$_2$ layer 20 is grown on the surface of the top mirror layer at 100° C. in a high vacuum chamber by electron beam evaporation. Thereafter the photoresist is stripped with acetone, and after the SiO$_2$ layer and that surface of the top mirror which is exposed in window 21 are plasma cleaned, a silver layer, from 10 to 50 Å thick, is deposited (preferably by evaporation) upon the SiO$_2$ layer and also on the exposed surface of the top mirror.

Electrode 23 of cadmium tin oxide (or indium tin oxide) is formed on top of barrier electrode 22 with a thickness from about 50 to 500 nm, preferably 200 to 300 nm. In this thickness range, electrode 23 is sufficiently optically transparent to the lasing emission enabling its use as a top electrode of the VCSEL. Thicknesses higher than 500 nm may result in an increased series resistance without any improvement in the lasing efficiency.

The growth of the optically transparent semiconductor layer 23 uses an RF magnetron sputtering system (Anelva Corp., Model SPF-332H). In an exemplary embodiment, the target was a sintered disk (3 inches in diameter, ¼ inch in thickness) of a mixture of about 67% CdO and about 33% SnO$_2$ (Haselden, San Jose, Calif.). The target was mounted 5 cm above the samples. The plate voltage was 1.5K V and the plate current approximately 110 mA. A deposition rate of 3 Å/sec was maintained during the growth. The sputtering gas was a mixture of argon and oxygen at a total pressure of from 3 to 4 Pa. The resistivity of cadmium tin oxide (CTO) film depends strongly on the partial pressure of oxygen. Minimum resistivity is obtained for an oxygen partial pressure $P_{o2}$ of about $2-4 \times 10^{-2}$ Pa in 2-4 Pa argon. The cadmium tin oxide film was deposited in a thickness of ~2000 Å. It has negligible absorption (less than 1%, which is limited by the capability of the setup) at 0.85 $\mu$m. The resistivity of this film is $\sim 5 \times 10^{-4}$ $\Omega$-cm. For the above target, voltage, current and argon pressure it was found that the resistivity increases rapidly for $P_{o2}$ of $1 \times 10^{-2}$ and higher. A standard buffered oxide etchant was used to etch the deposited cadmium tin oxide layer in the process of device isolation. A top electrode of indium tin oxide (ITO) material may be produced in a similar manner.

Before characterizing the lasing properties, the substrate side of the sample is bonded with conductive epoxy on a copper slab which serves as a heat sink. No other cooling is used. All the experiments are done at room temperature. A fine probe is used to electrically contact and pump the lasers. Current is vertically injected through the window area, as shown by straight arrows in FIG. 1, and the remaining area of the device surface is electrically isolated from the top electrode with the SiO$_2$ layer 20.

Figure 2:
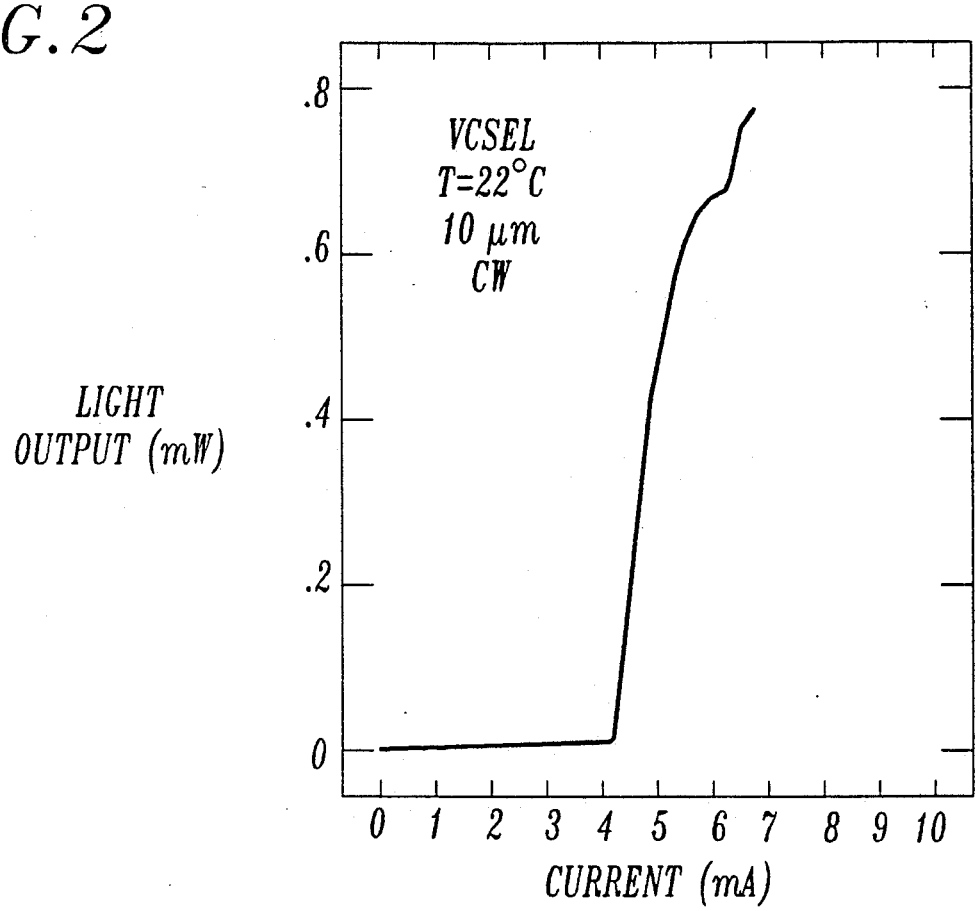
FIG. 2 discloses continuous wave light output power versus direct current at room temperature; the lasing threshold is 4.2 mA; the lasing wavelength is at ~0.85 μm.
Figure 3:
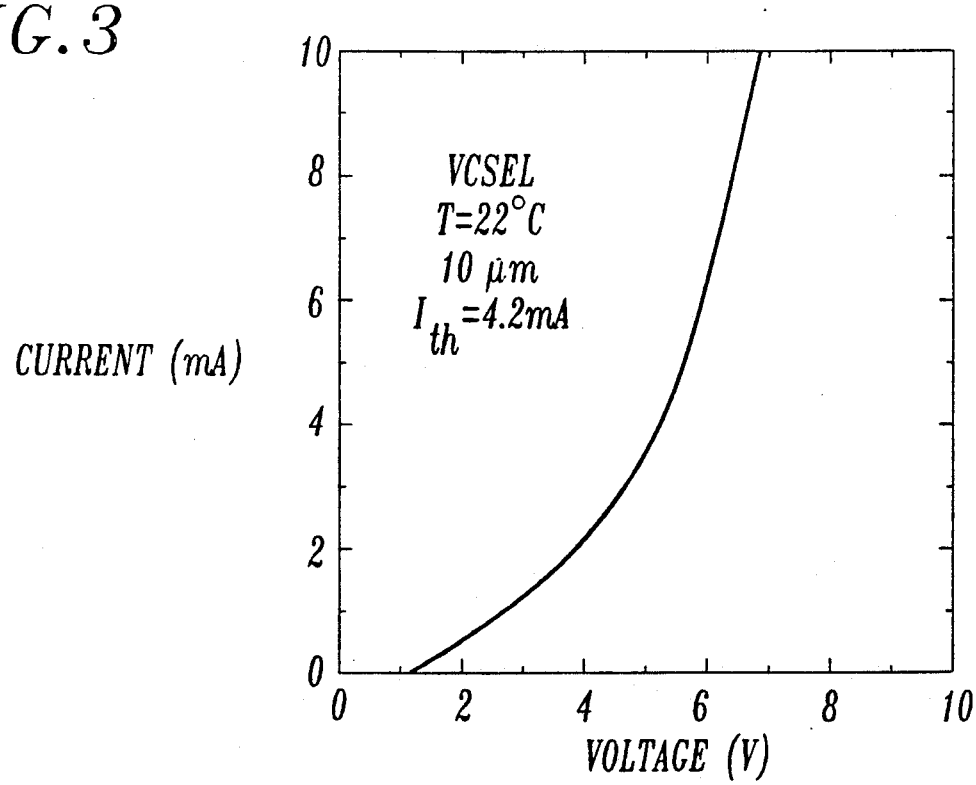
FIG. 3 discloses current versus voltage curve at room temperature; the voltage at lasing is 5.4 V with a differential series resistance of 430Ω at the lasing threshold of 4.2 mA.
Figure 4:
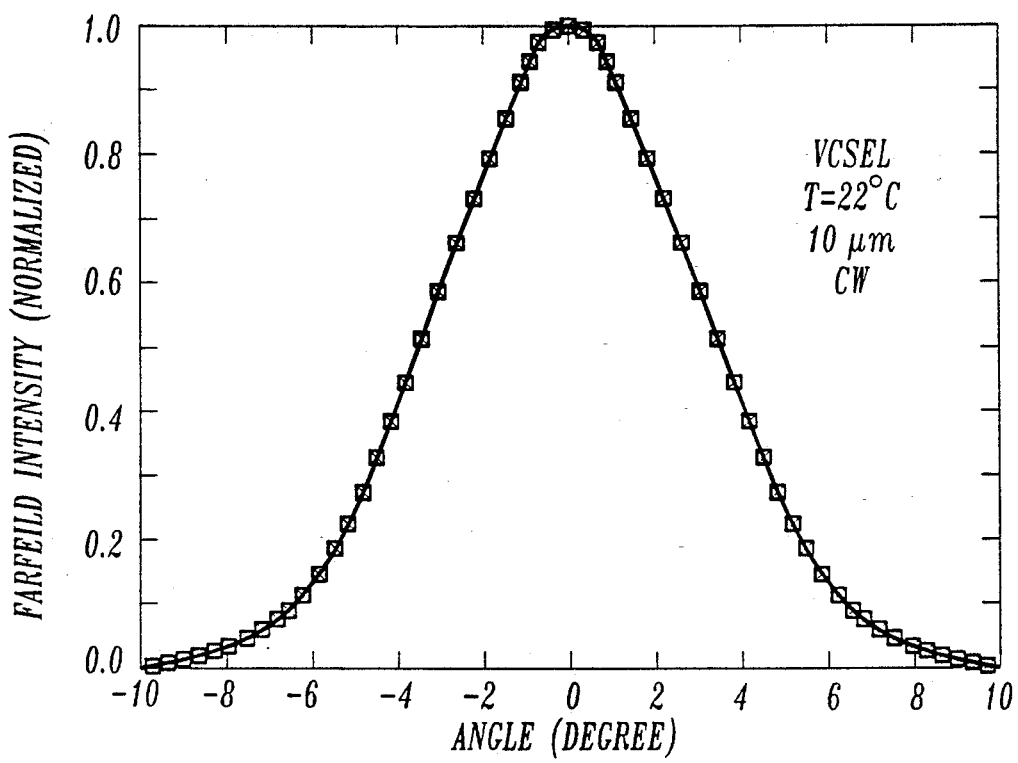
FIG. 4 discloses far field light intensity distribution under continuous wave operation at 5 mA; it is Gaussian-like with a full width at half maximum of 7.0°. Data points are connected by straight lines and normalized light intensity is shown.

FIG. 2 is the continuous wave light output power versus direct current. The light output power is measured with an ANDO AQ-1125 optical power meter calibrated at 0.85 $\mu$m. The lasing threshold current is 4.2 mA with ~35% external differential quantum efficiency at a lasing wavelength of ~0.85 $\mu$m. Threshold currents as low as 3.8 mA are obtainable. 50 Å thick barrier layer 22 causes a small reduction in the laser output power (about 10%). FIG. 3 is the current-voltage curve which shows a voltage of 5.4 V and a differential series resistance of 430$\Omega$ at the lasing threshold of 4.2 mA. FIG. 4 shows the far field light intensity distribution measured at a detector-sample distance of 8.3 cm. The distribution is Gaussian-like, indicating a single fundamental transverse mode operation, with a full width at half maximum of 7.0°. Measurement is performed at stepped intervals of ~0.35° each, with a resolution of better than 0.2°.

Figure 5:
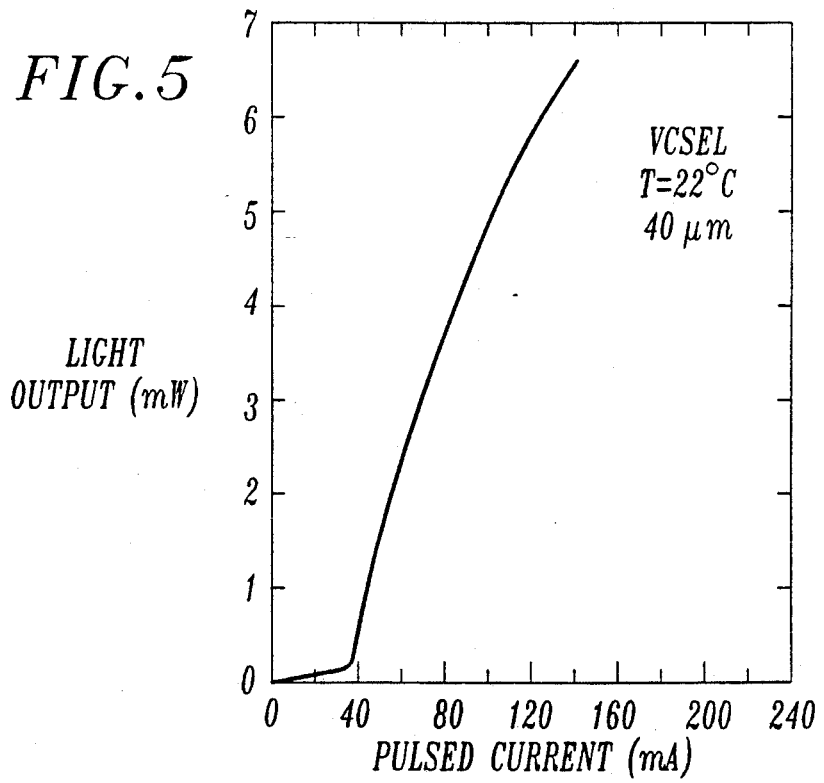
FIG. 5 discloses light versus current curve for a structure without ion implantation under 100 ns and 1 kHz pulsed current; the threshold current density is 3 kA/cm$^2$.

It is also possible to fabricate a structure without the ion implantation region 18. In such a case, top mirror 17 is mesa-etched, and probed directly at the top window area. A device with a 40 $\mu$m diameter mesa gives a pulsed (100 ns, 1 kHz) threshold current of 40 mA, which yields a threshold current density of 3 kA/cm$^2$ (see FIG. 5). More than 30% reduction in the light output power results from 300 Å thick Ag barrier layer in this sample, and the blocking by a probe itself. The light output power at 140 mA is 6.5 mW.

We claim:

1. A semiconductor vertical cavity surface emitting laser comprising a semiconductor body which comprises a plurality of layers selected from Group III-V and II-VI compound semiconductors having nominal formula GaAs, InP, InGaAs, InGaPAs, AlAs, AlGaAs, and AlGaInAs, said plurality of layers including an active region which generates optical radiation, a bottom multilayer mirror which reflects said radiation, a top multilayer mirror which partially reflects and partially transmits said radiation in a direction perpendicular to said active region, said top mirror including an ion-implanted region arranged peripherally of the layers of said top mirror and defining a window for confining passage of current and of lasing emission to an area defined by said window, a dielectric layer upon said top mirror, said dielectric layer having a window aligned with said window in said ion-implanted region, a metallic barrier layer upon said dielectric layer and contacting that surface of said top mirror layer which is exposed in said window of said dielectric mirror layer, a layer of an optically transparent semiconductor material on said metal barrier layer forming a top electrode of the laser, said optically transparent layer having conductivity ranging from $1 \times 10^3$ to $1 \times 10^5 \Omega^{-1} cm^{-1}$, light transmissivity of at least 80 percent and absorption of less than 10 percent, and a bottom electrode for applying in unity with said top electrode an excitation current in direction substantially perpendicular to said active region and substantially parallel to the direction of propagation of optical radiation.

2. The laser of claim 1, in which said optically transparent semiconductor material of said top electrode is selected from the group consisting of cadmium tin oxide and indium tin oxide.

3. The laser of claim 2 in which the thickness of said top electrode ranges from 50 to 500 nm.

4. The laser of claim 2 in which the thickness of said top electrode ranges from 200 to 300 nm.

5. The laser of claim 1, in which the metal of said metallic barrier layer is selected from the group consisting of Ag, Au, AuBe, AuZn, Cr, and Ti.

6. The laser of claim 5, in which said metal is silver.

7. The laser of claim 6, in which the thickness of said silver layer ranges from 10 to 50 Å.

8. The laser of claim 1, in which said dielectric material is selected from the group consisting of $SiO_2$, $Si_3N_4$, and borosilicate glass.

9. The laser of claim 8, in which said dielectric material is $SiO_2$ deposited in a thickness of from 0.01 to 0.1 $\mu$m.

10. The laser of claim 1, in which said bottom mirror is a multilayer distributed Bragg reflection mirror comprising from 10 to 40 periods.

11. The laser of claim 10 in which said bottom mirror is a 30 period structure.

12. The laser of claim 11, in which said active region is GaAs, and each of said periods comprises a pair of quarterwave layers selected from AlAs and GaAs and from AlAs and $Al_{0.05}Ga_{0.95}As$.

13. The laser of claim 12, in which said active layer is GaAs, and each of said periods is of a structure which includes $Al_{0.14}Ga_{0.86}As$(500 Å)/$Al_{0.57}Ga_{0.43}As$(100 Å/AlAs (580 Å)/$Al_{0.57}Ga_{0.43}As$(100 Å).

14. The laser of claim 12, in which said bottom mirror structure is liearly graded.

15. The laser of claim 12, in which said bottom mirror structure is a superlattice graded structure.

16. The laser of claim 1, in which said top mirror is one-step graded multilayer distributed Bragg reflection mirror comprising from 2 to 20 periods.

17. The laser of claim 16, in which said active layer is GaAs and each of said periods of said top mirror is of a structure which includes $Al_{0.14}Ga_{0.86}As$(500 Å)/$Al_{0.57}Ga_{0.43}As$(100 Å/AlAs (580 Å)/$Al_{0.57}Ga_{0.43}As$(100 Å).

18. The laser of claim 1, in which said ion-implanted region includes ions selected from $H^+$ and $O^+$.

19. The layer of claim 18, in which said ion is $H^+$.

* * * * *

UNITED STATES PATENT AND TRADEMARK OFFICE
CERTIFICATE OF CORRECTION

PATENT NO. : 5,115,441

DATED : May 19, 1992

INVENTOR(S) : R.F. Kopf, H.M. O'Bryan, E.F. Schubert, L.W. Tu, Y-H. Wang, G.J. Zydzik It is certified that error appears in the above-identified patent and that said Letters Patent is hereby corrected as shown below:

On title page, item [54], line 1, and col. 1, line 1, in the Title " EMMITTING" should read --EMITTING--.

Column 10, line 18 "liearly" should read --linearly--.

Signed and Sealed this

Third Day of August, 1993

Attest:

MICHAEL K. KIRK

Attesting Officer

Acting Commissioner of Patents and Trademarks